United States Patent [19]

Tseng et al.

[11] Patent Number: 5,663,093

[45] Date of Patent: Sep. 2, 1997

[54] METHOD FOR FORMING A CYLINDRICAL CAPACITOR HAVING A CENTRAL SPINE

[75] Inventors: Horng-Huei Tseng; Chih-Yuan Lu, both of Hsinchu, Taiwan

[73] Assignee: Vanguard International Semiconductor Corporation, Hsin-Chu, Taiwan

[21] Appl. No.: 665,328

[22] Filed: Jun. 17, 1996

[51] Int. Cl.[6] .............................................. H01L 21/8242
[52] U.S. Cl. ................................................................ 438/396
[58] Field of Search ...................... 437/47, 60, 195, 437/915, 919; 148/DIG. 14

[56] References Cited

U.S. PATENT DOCUMENTS

| | | | |
|---|---|---|---|
| 5,185,282 | 2/1993 | Lee et al. | 437/47 |
| 5,436,187 | 7/1995 | Tanigawa | 437/60 |
| 5,476,806 | 12/1995 | Roh et al. | 437/52 |
| 5,491,103 | 2/1996 | Ahn et al. | 437/52 |
| 5,543,346 | 8/1996 | Keum et al. | 437/919 |

Primary Examiner—Chandra Chaudhari
Attorney, Agent, or Firm—George O. Saile; William J. Stoffel

[57] ABSTRACT

A method for manufacturing a cylindrical stacked capacitor having a central spine for a DRAM using only one photo mask is provided. The invention uses sidewall spacers and selective etching techniques to form a low cost, simple to manufacture, high capacitance capacitor and DRAM cell. A substrate having source regions, drain regions and gate electrode structures is provided. An insulating layer with a contact opening is formed over the substrate surface. A first conductive layer and a first dielectric layer are formed over the insulating layer. The first dielectric layer and first conductive layer are etched forming a central spine over the contact opening. The etched first dielectric layer forms a dielectric cap over central spine. Dielectric spacers are formed on the sidewall of the central spine and the dielectric cap. The remaining portions of the first conductive layer are anisotropically etched using the dielectric spacers and the dielectric cap as a mask. Conductive spacers are formed on the sidewalls of the dielectric spacers. The dielectric cap and the dielectric spacers are selectively etched thereby forming a crown shaped storage node having a central spine. A capacitor dielectric layer and a top electrode are formed over the crown shaped storage node and the insulating layer forming a crown shaped capacitor.

18 Claims, 5 Drawing Sheets

METHOD FOR FORMING A CYLINDRICAL CAPACITOR HAVING A CENTRAL SPINE

BACKGROUND OF INVENTION

1) Field of the Invention

The present invention relates generally to the fabrication of capacitors and particularly to a method for fabricating a highly integrated semiconductor memory having a stacked capacitor and more particularly to a method for forming a cylindrical stacked capacitor having a central spine.

2) Description of the Prior Art

The development of the semiconductor industry has always followed that of the Dynamic Random Access Memory (DRAM) technology in that DRAM development has led in the use of the highest density technology elements capable of being produced in manufacturable quantities. Problems, such as alpha-particle soft errors and maintaining minimum signal-to-noise ratios, require capacitors for DRAMs to have a maximum capacitance per memory cell area. However, the memory cell area is reduced by at least 200% for each new generation. With this trend in memory cell miniaturization, maintaining a nearly unsealed capacitance value is a challenge that requires substantial engineering effort and inventive ingenuity. The development of DRAM's in the 4 Megabit density range began to depart from the twenty year tradition of two-dimensional DRAM designs by the appearance of three-dimensional DRAM cell structures, most notable by the use of trench capacitors. Proposed designs for DRAM cells in 16 MB, 64 MB and high density range have also included the use of multi-plate or stacked storage capacitor cell designs. Although the use of stacked cell technology has rendered the processing of DRAMs more complex such techniques continue to be used extensively.

The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of the memory cell as well as consumes excessive power during low-voltage operation by impeding device operation.

Generally, in a 64 MB DRAM having a 1.5 $\mu m^2$ memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitors include, for example double-stacked, fin-structured, cylindrical, spread-stacked, and box structured capacitors.

Since both outer and inner surfaces can be utilized as an effective capacitor area, the cylindrical structure is favorably suitable to the three-dimensional stacked capacitor, and is more particularly suitable for an integrated memory cell which is 64 Mb or higher. Also, an improved stacked capacitor has recently been presented, where pillars or another inner cylinder is formed in the interior of another cylinder. Not only may both of the inner and outer surfaces of the cylinder be utilized as the effective capacitor area, but also the outer surface of the pillars or the inner cylinder formed in the interior of the cylinder. However, even more surface area and capacitance are required to achieve higher densities. This invention relates to a process for increasing the capacitance of a multi-pillar capacitor.

The following U.S. Patents show related processes and capacitor structures. U.S. Pat. No. 5,476,806 (Roh), U.S. Pat. No. 5,185,282 (Lee), and U.S. Pat. No. 5,491,103 (Ahn) disclose methods for forming crown type stacked capacitors. However, these methods can be further improved upon. Many of these methods require substantially more processing steps or/and planar structures which make the manufacturing process more complex and costly. Also, other process methods rely on etching to a predetermined etch depth which can be quite difficult to control in a manufacturing environment. Therefore, it is very desirable to develop processes that are as simple as possible and also have large process windows.

There is also a challenge to develop methods of manufacturing these capacitors that minimize the manufacturing costs and maximize the device yields. There is also a challenge to develop a method to produce a capacitor with a minimum leakage current, a larger capacitance, a higher reliability and which is easy to manufacture.

SUMMARY OF THE INVENTION

It is an object of the present invention to provide a method for fabricating a cylindrical crown shaped capacitor which has a large capacitance, ensures high reliability, and is easy to manufacture.

It is an object of the present invention to provide a method for fabricating a cylindrical stacked capacitor which has a central pillar and large cell capacitance.

It is an object of the present invention to provide a method DRAM having a cylindrical capacitor.

To accomplish the above objectives, the present invention provides a method of manufacturing a stacked capacitor for a DRAM on a substrate having source regions, drain regions and gate electrode structures. An insulating layer is formed over the substrate surface. A contact opening is formed exposing the source region. A first conductive layer is formed over the insulating layer and fills the contact opening thereby forming an electrical contact with the source region. A first dielectric layer is formed over the conductive layer. The first dielectric layer and first conductive layer are etched forming a central spine over the contact opening. The etched first dielectric layer forms a dielectric cap over central spine. The first dielectric layer is remains over portions of the first conductive layer covering the insulation layer. A second dielectric layer formed over the remaining potions of the first conductive layer, the central spine and the dielectric cap. The second dielectric layer is anisotropically etched forming dielectric spacers on the sidewall of the central spine and the dielectric cap. The remaining portions of the first conductive layer are anisotropically etched using the dielectric spacers and the dielectric cap as a mask exposing the insulating layer. A second conductive layer is formed over insulating layer, central spine, the dielectric spacers and dielectric cap layer. The second conductive layer anisotropically etched forming conductive spacers on the sidewalls of the dielectric spacers. The dielectric cap and the dielectric spacers are selectively etched thereby forming a crown shaped storage node having a central spine. A capacitor dielectric layer and a top electrode formed over the crown shaped storage node and the insulating layer forming a stacked capacitor.

The method of the current invention forms a cylindrical shaped capacitor having a central spine which has a high surface area and capacitance. The invention eliminates several expensive photo masks steps by using sidewall spacer and selective etch techniques. This reduces manufacturing costs and provides a simple process. The sidewall spacer techniques reduce the capacitor size and increase the capacitance.

BRIEF DESCRIPTION OF THE DRAWING

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Now in keeping with the objectives of this invention, the method for forming a DRAM cylindrical storage capacitor is described in detail. The general overall sequence of fabrication steps for the cylindrical capacitor and DRAM is shown in FIGS. 1 through 10. Also, the term "dimension" includes the length, width, or diameter of the object being described, whether the object is irregularly shaped or regularly shaped, such as a circle or rectangle. Also, in this specification, the term "about" when describing a number or a range, means plus or minus 10% of that number or range.

Figure 1:
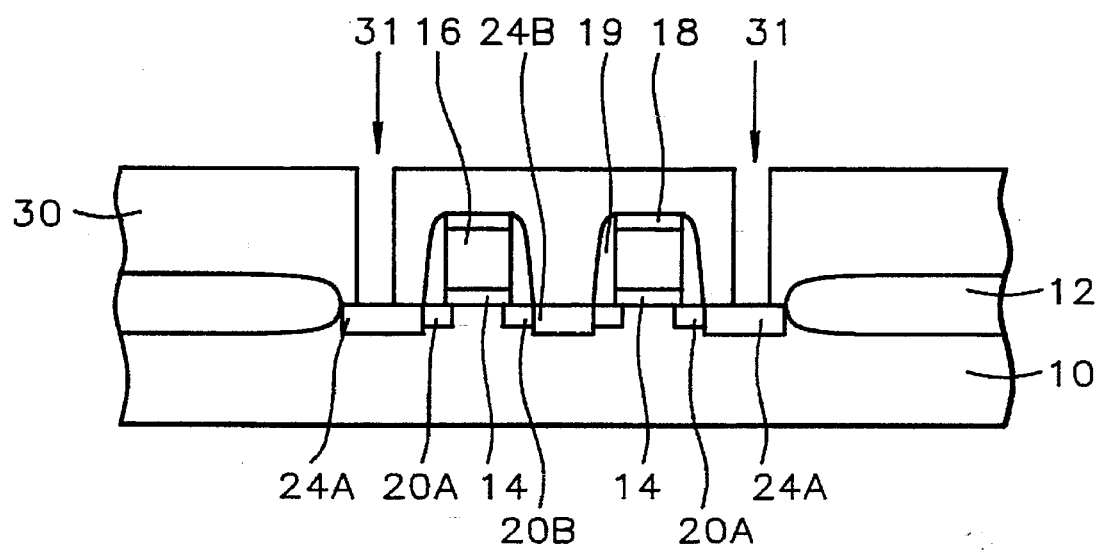
FIGS. 1 through 10 are cross sectional views for illustrating method for manufacturing the capacitor and DRAM cell according to the present invention.

Referring to FIG. 1, it is assumed that an unit semiconductor element, for example a MOSFET, which is partially completed is formed on the silicon substrate 10 upon which the capacitor according to the present invention will be formed. The substrate can have active areas including an array of memory cells, each of the memory cells having a MOSFET transistor. The capacitor is formed over a memory cell area in the substrate. The transistor can comprise: a source 24A, lightly doped source 20a, drain 24B, lightly doped drain 20B, gate oxide layer 14, gate electrode 16, spacers 19 and a top gate insulting layer 18, and other devices, such as a bit line, word lines, p and n wells, and field oxide regions 12. These devices can be formed using conventional semiconductor processing techniques. FIG. 1 shows representations, not detailed and not to scale, of various elements in one possible configuration. The devices can be formed using conventional fabrication techniques. The capacitor in a memory cell is formed over the related transistor components in a cell area on the substrate.

As shown in FIG. 1, a first insulating layer 30 is formed over the substrate 10 surface including the source, drain 24A 24B and transfer gate structures 14 16 18 19 of the DRAM cell. The first insulating layer 30 is preferably composed of silicon nitride, silicon oxide, or a doped silicon oxide, such as phosphosilicate glass (PSG), or borophosphosilicate glass (BPSG). The first insulating layer 30 preferably has a thickness in a range between about 5000 and 10,000 Å. The first insulating layer 30 can include several underlying layers, such as a conformal silicon oxide layer. Next, a contact hole 31 is etched through the first insulating layer 30 and exposes an active region, such as a source 24A.

Figure 2:
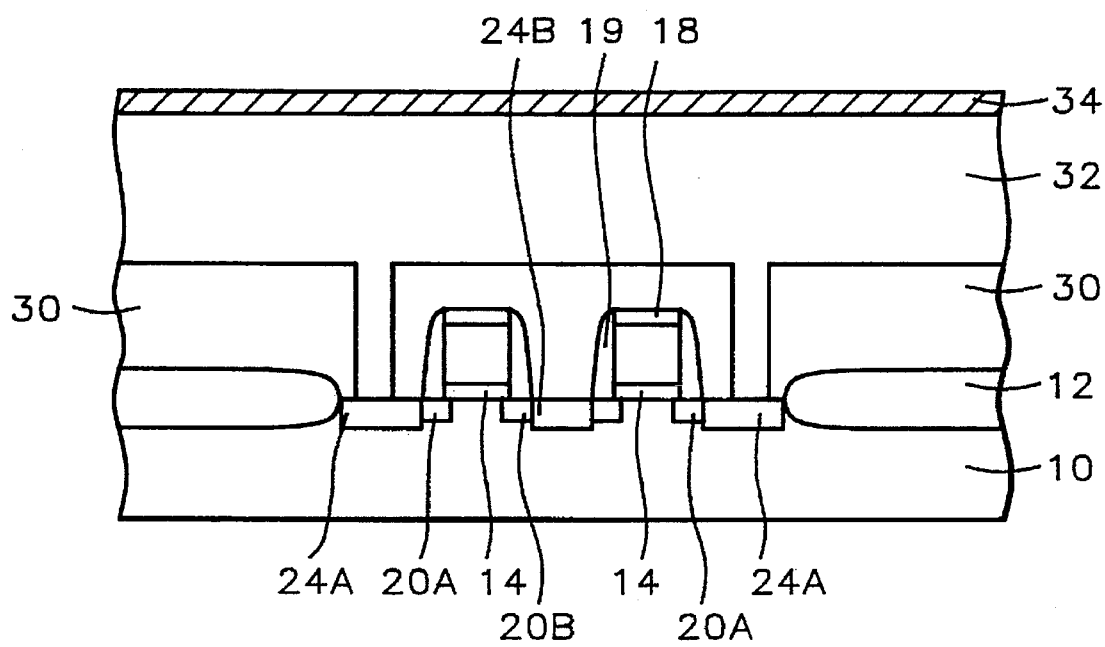

As shown in FIG. 2, a first conductive layer 32 (e.g., doped polysilicon) is formed over the insulating layer 30 and fills the contact opening 31 forming an electrical contact with the source region 24A. The first conductive layer 32 fills the contact hole 31 and makes an electrical connection to the source region 20A on the substrate surface. The first conductive layer 32 is preferably formed of polysilicon and more preferably formed of doped polysilicon. The first conductive layer preferably has a thickness in a range of between about 1000 and 4000 Å. The first conductive layer 32 is preferably doped by an insitu process or by an ion implant process using arsenic ions. The first conductive layer preferably has an impurity concentration in a range of between about 1E20 and 1E21 atoms/cm$^3$. A polysilicon layer can be deposited by prolysing silane in a low pressure chemical vapor deposition process less than 600 C.

As shown in FIG. 2, a first dielectric layer 34 (e.g., a silicon nitride layer) is formed over the conductive layer 32. The first dielectric layer 34 is preferably formed of silicon nitride and preferably has a thickness in a range of between about 500 and 2000 Å. The first dielectric layer composed of silicon nitride is preferably formed by a LPCVD process. The silicon nitride layer 34 can be formed by reacting silane and ammonia at atmospheric pressure at 700° to 900° C., or by reacting dichlorosilane and ammonia at reduced pressure at approximately 700° C.

Figure 3:
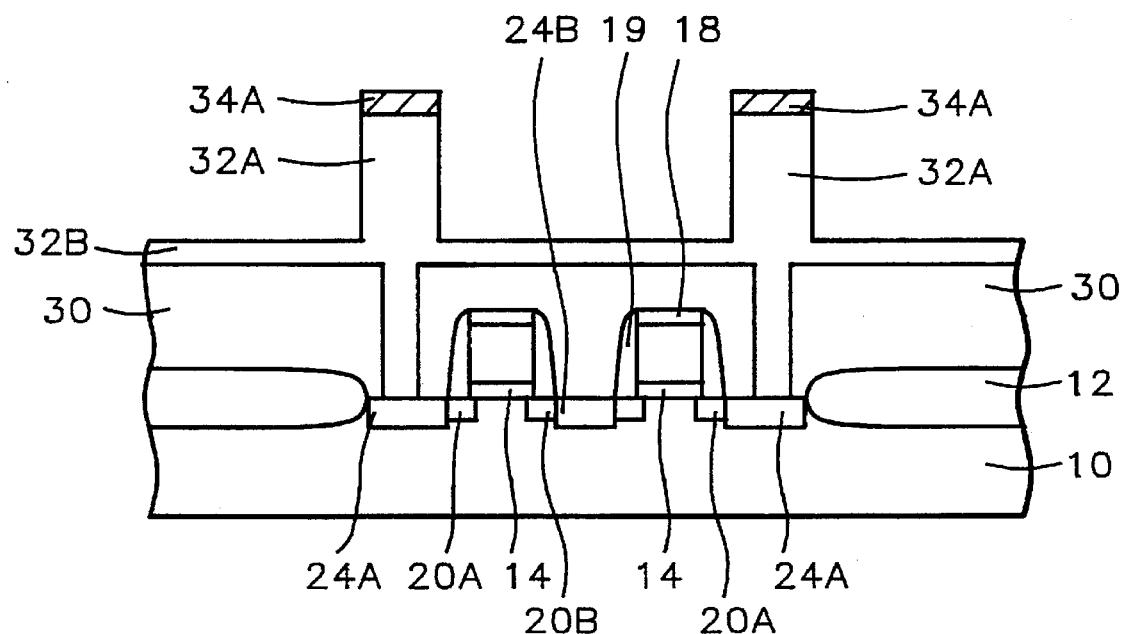

Referring to FIG. 3, the first dielectric layer 34 and first conductive layer 32 are patterned to form a central spine (32A) over the contact opening and to form a dielectric (e.g., nitride) cap 34A over the central spine; and leaving upper portions of the first conductive layer are left coveting the insulation layer 30. The central spine 32A and the dielectric (e.g., nitride) cap 34A have sidewalls. The central spine preferably has a square, rectangular, or cylindrical shape and more preferably a cylindrical shape.

Figure 4:
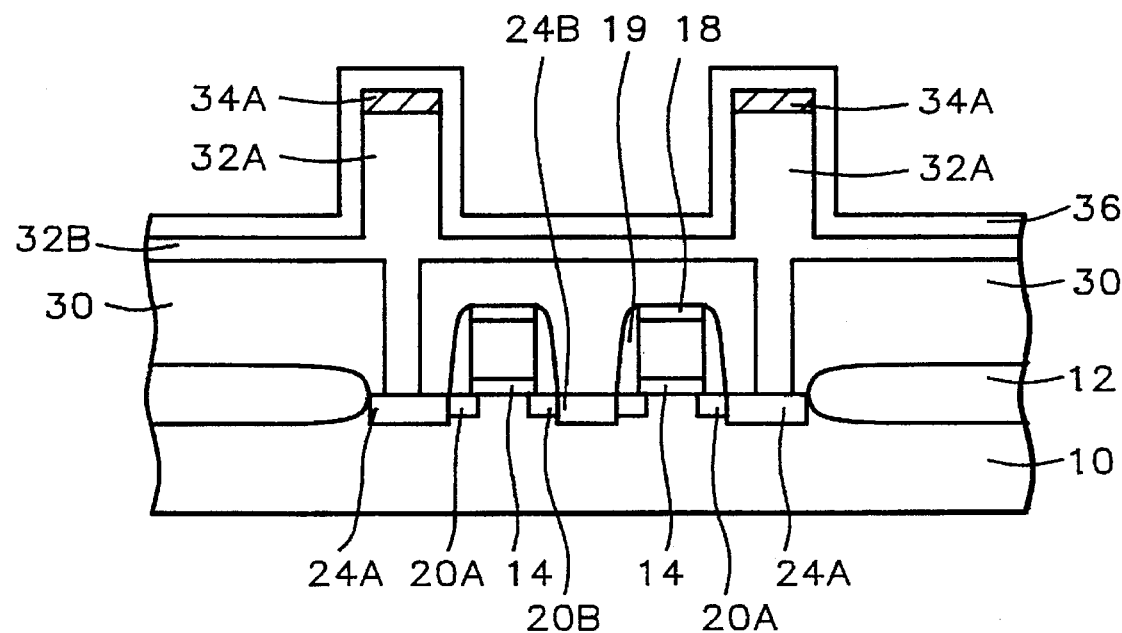

As shown in FIG. 4, a second dielectric (e.g., nitride) layer 36 is formed over the remaining potions of the first conductive layer 32B, the central spine 32A, and the dielectric cap 34A. The second dielectric layer 36 is preferably formed of silicon nitride. The second dielectric layer preferably has a thickness in a range of between about 1000 and 3000 Å.

Figure 5:
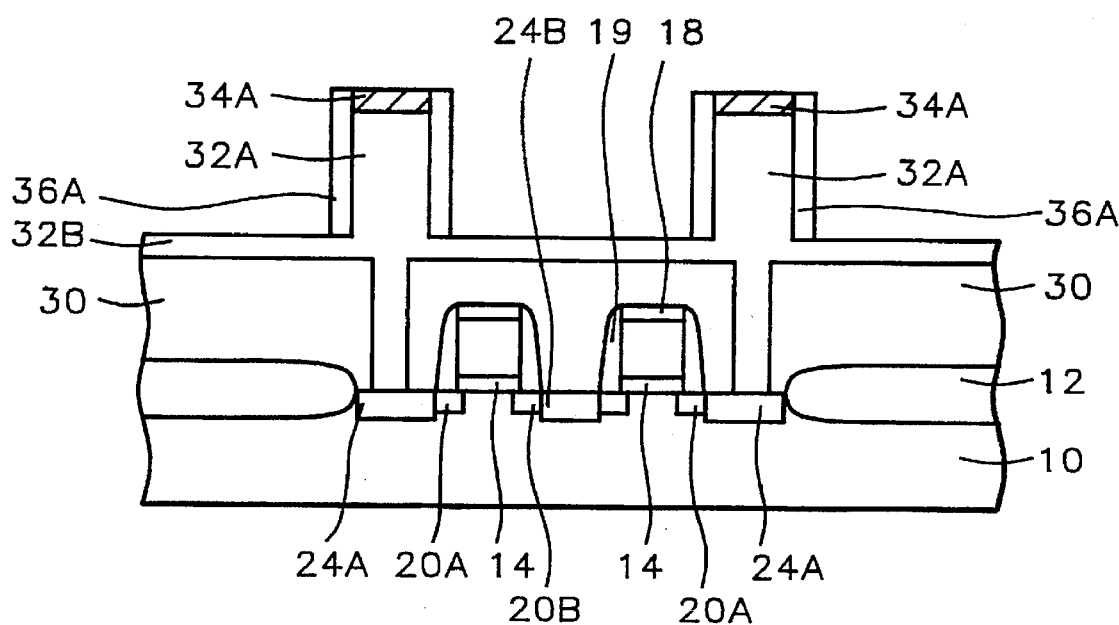

As shown FIG. 5, the second dielectric (e.g., nitride) layer 36 is then anisotropically etched forming dielectric (e.g., nitride) spacers 36A on the sidewall of the central spine and the dielectric (nitride) cap 34A. The dielectric (e.g., nitride) spacers 36a have sidewalls. The spacers 36 preferably have a thickness (width) in a range of between about 500 and 1500 Å and a height in a range of between about 3000 and 6000 Å.

Figure 6:
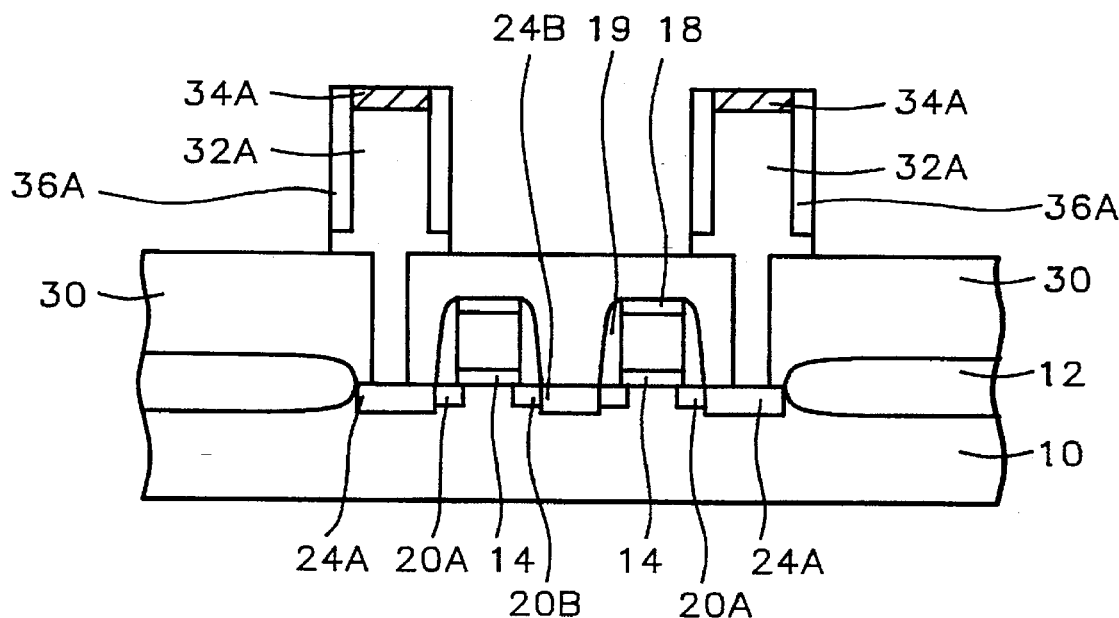

As shown in FIG. 6, the remaining portions of the first conductive layer 32B are anisotropically etched using the dielectric (nitride) spacers 36A and the dielectric (nitride) cap 34A as a mask exposing the insulating layer 30. The anisotropic etch is preferably a RIE etch using Cl$_2$ and HBr. This anisotropic etch can be accomplished by reactive ion etching with Cl$_2$ at 420 sccm, HBr at 80 sccm, and He at 180 sccm, at a pressure of about 300 mtorr, and a power of about 450 watts. A Rainbow 4420, manufactured by Lam Research Company, may be used for this etch.

Figure 7:
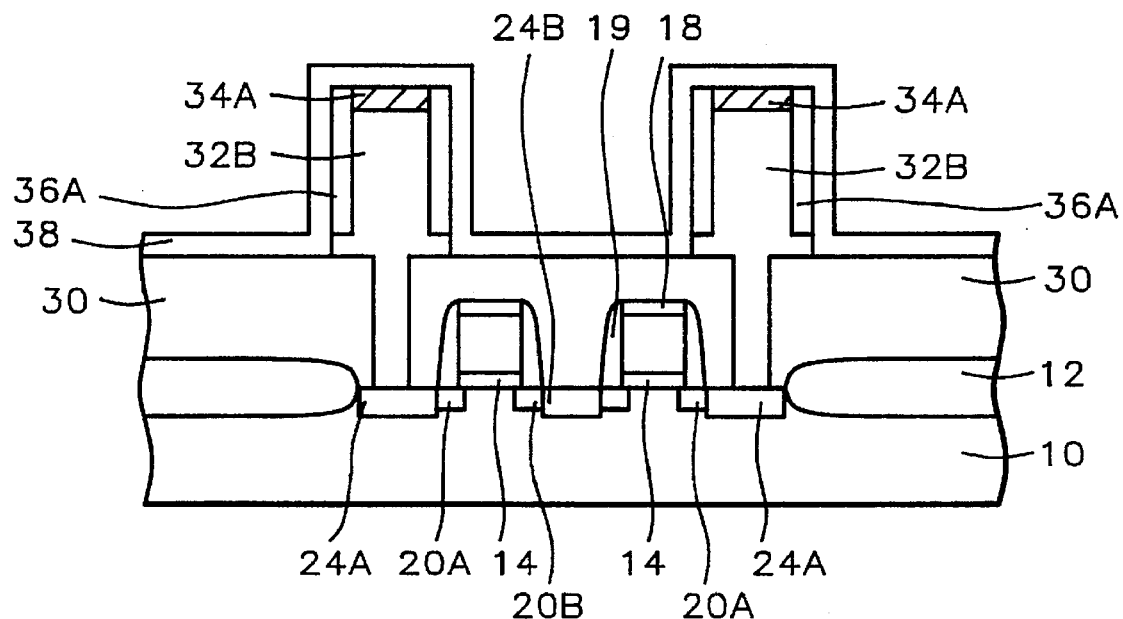
Figure 8:
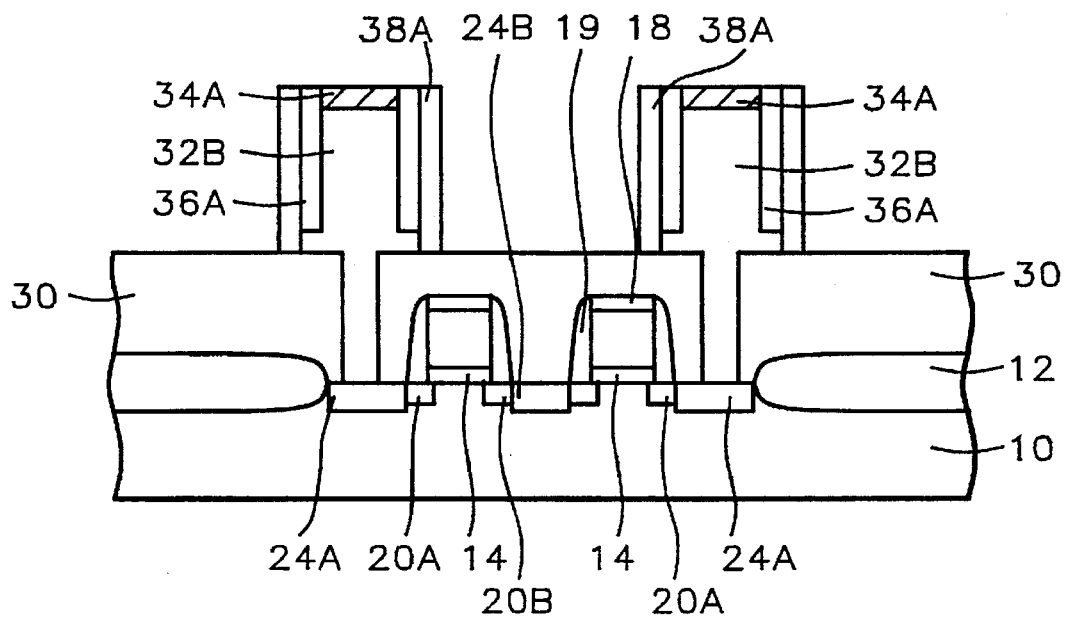

As displayed in FIG. 7, a second conductive layer 38 is formed over the insulating layer 30, central spine 32B, the dielectric (nitride) spacers and dielectric (nitride) cap layer 34A. The second conductive layer is preferably formed polysilicon and more preferably dope polysilicon. The second conductive layer preferably has a thickness in a range of between about 1000 and 3000 Å. The second conductive layer is preferably doped by an insitu process or by an ion implant process using arsenic ions. The second conductive layer preferably has an impurity concentration in a range of between about 1E20 and 1E 21 atoms/cm$^3$. As shown in FIG. 8, the second conductive layer 38 is anisotropically etched forming conductive spacers 38A on the sidewalls of the dielectric (nitride) spacers 36A. The conductive spacers 38a preferably have a width (thickness) in a range of between about 500 and 2000 Å. The conductive spacers 38A preferably have a height in a range of between about 3000 and 6000 Å.

Figure 9:
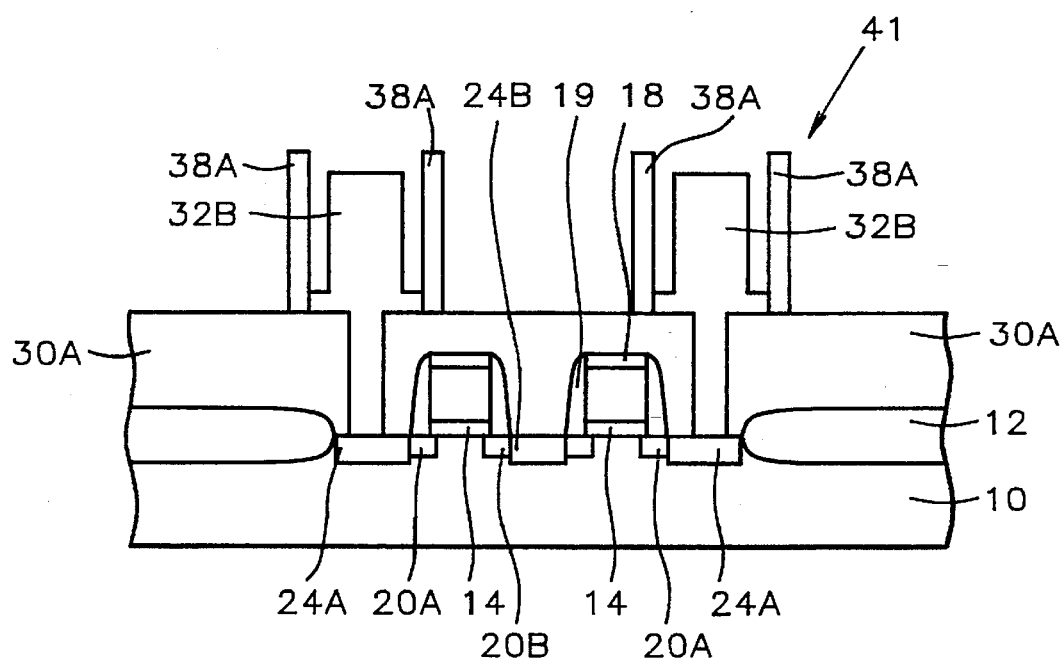

As shown in FIG. 9, the dielectric cap 34A and the dielectric spacers 36A are removed thereby forming a crown shaped storage node (bottom electrode) having a central spine. The dielectric cap 34A and the dielectric spacers 36A are removed preferably by a selective etch using $H_3PO_4$. The selective etch removes the dielectric material layers but does not significantly etch the silicon or silicon oxide layers.

Figure 10:
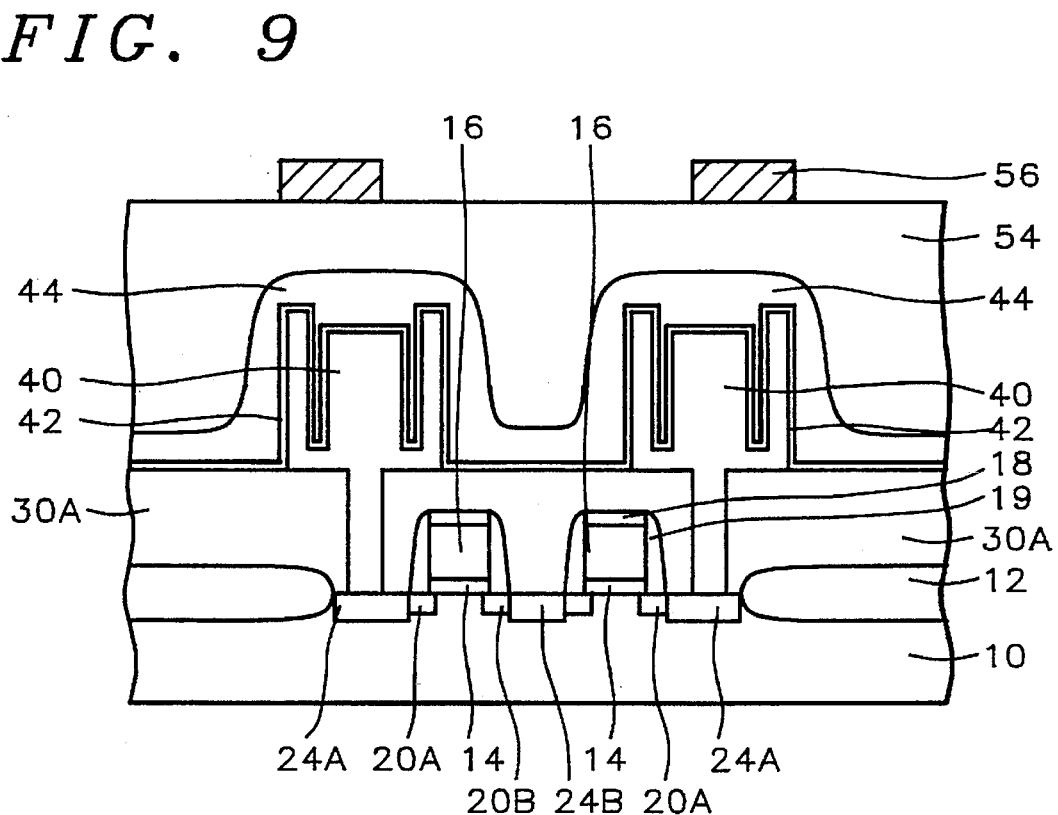

As shown in FIG. 10, a capacitor dielectric layer and a top electrode are formed over the bottom storage node 40 and the insulating layer 30A thereby forming a cylindrical crown capacitor. The capacitor dielectric layer is preferably composed of: oxide/nitride/oxide (ONO), silicon nitride, $Ta_2O_5$, or silicon oxide. The capacitor dielectric layer preferably has a thickness in a range between about 40 and 60 Å. The top plate electrode is preferably formed of polysilicon and more preferably formed doped polysilicon. The top plate electrode preferably has a thickness in a range between about 800 to 2000 Å. The top plate electrode preferably has an impurity concentration in a range between about 1E19 and 1E21 atoms/$cm_3$.

Still referring to FIG. 10, a top insulation layer 54 (e.g., a passivation layer) is then formed over the top plate electrode. The top insulation layer 54 is preferably formed of silicon oxide, doped silicon oxide, and borophosphosilicate glass (BPSG), and is more preferably formed of silicon oxide. Metal layers 56 are formed over the top insulating layer 54 and in vias in the top insulating layer to connect the devices in a circuit. Additional metal layers and passivation layers (not shown) are formed over the top insulation layer 54 to connect the other device elements to form memory cell arrays and other devices.

The method of the current invention forms a cylindrical capacitor having a central spine which has a high surface area and capacitance. The invention uses only one photo mask to form the cylindrical capacitor having a central spine. The invention eliminates several expensive photo masks steps by using sidewall spacer and selective etch techniques. This reduces manufacturing costs and provides a simple process. The sidewall spacer techniques reduce the capacitor size and increase the capacitance.

While the invention has been particularly shown and described with reference to the preferred embodiments thereof, it will be understood by those skilled in the art that various changes in form and details may be made without departing from the spirit and scope of the invention.

What is claimed is:

1. A method of forming a stacked capacitor on a substrate having source regions, drain regions and gate electrode structures comprising:

a) forming an insulating layer over said substrate surface;

b) forming a contact opening exposing said source region;

c) forming a first conductive layer over said insulating layer and filling said contact opening to form an electrical contact with said source region;

d) forming a first dielectric layer over said conductive layer;

e) patterning said first dielectric layer and first conductive layer to form a central spine over said contact opening and to form a dielectric cap over central spine, and leaving portions of said first conductive layer covering said insulation layer, said central spine, said dielectric cap having sidewalls;

f) forming dielectric spacers on said sidewalls of said central spine and said dielectric cap, said dielectric spacers having sidewalls;

g) anisotropically etching said remaining portions of said first conductive layer using said dielectric spacers and said dielectric cap as a mask exposing said insulating layer;

h) forming conductive spacers on said sidewalls of said dielectric spacers;

i) selectively etching completely said dielectric cap and said dielectric spacers thereby forming a crown shaped storage node having a central spine;

sequentially forming a capacitor dielectric layer and a top electrode over said crown shaped storage node and said insulating layer thereby forming a crown shaped capacitor.

2. The method of claim 1 wherein said insulating layer is formed of a material selected from the group consisting of Silicon Nitride, phosphosilicate glass (PSG), borophosphosilicate glass (BPSG) and silicon oxide, and has a thickness in a range between about 5000 and 10,000 Å.

3. The method of claim 1 wherein said first conductive layer is formed of doped polysilicon and has a thickness in a range of between about 1000 and 4000 Å.

4. The method of claim 1 wherein said first dielectric layer is composed of silicon nitride and has a thickness in a range of between about 500 and 2000 Å.

5. The method of claim 1 wherein said second dielectric layer is formed of polysilicon, and has a thickness in a range of between about 1000 and 3000 Å.

6. The method of claim 1 wherein central spine has a shape selected from the group consisting of: cylindrical and rectangular (box) shape.

7. The method of claim 1 wherein said second conductive layer 38 is formed of doped polysilicon and has a thickness in a range of between about 1000 and 3000 Å.

8. The method of claim 1 wherein said dielectric spacers have a width in a range of between about 500 and 1500 Å, and a height in a range of between about 3000 and 6000 Å.

9. The method of claim 1 wherein said conductive spacers have a width in a range of between about 500 and 2000 Å, and a height in a range of between about 3000 and 6000 Å.

10. A method of forming a stacked capacitor for a DRAM on a substrate having source regions, drain regions and gate electrode structures comprising:

a) forming an insulating layer composed of silicon oxide over said substrate surface;

b) forming a contact opening exposing said source region;

c) forming a first conductive layer comprised of doped polysilicon over said insulating layer and filling said contact opening forming an electrical contact with said source region;

d) forming a first dielectric layer composed of nitride over said conductive layer;

e) patterning said first dielectric layer and first conductive layer forming a central spine over said contact opening and forming said a dielectric cap over central spine, and leaving potions of said first conductive layer covering said insulation layer, said central spine, said dielectric cap having sidewalls;

forming a second dielectric layer composed of silicon nitride over said remaining potions of said first conductive layer, said central spine and said dielectric cap;

g) anisotropically etching said second dielectric layer forming dielectric spacers on said sidewalls of said central spine and said dielectric cap, said dielectric spacers having sidewalls;

h) anisotropically etching said remaining portions of said first conductive layer using said dielectric spacers and said dielectric cap as a mask exposing said insulating layer;

i) forming a second conductive layer over insulating layer, central spine, said dielectric spacers and dielectric cap layer;

j) anisotropically etching said second conductive layer forming conductive spacers on said sidewalls of said dielectric spacers;

k) selectively etching completely said dielectric cap and said dielectric spacers thereby forming a crown shaped storage node having a central spine; and l) forming a capacitor dielectric layer and a top electrode over said crown shaped storage node and said insulating layer thereby forming a crown shape capacitor.

11. The method of claim 1 wherein said insulating layer has a thickness in a range between about 5000 and 10,000 Å.

12. The method of claim 10 wherein said first conductive layer has a thickness in a range of between about 1000 and 4000 Å.

13. The method of claim 10 wherein said first dielectric layer has a thickness in a range of between about 500 and 2000 Å.

14. The method of claim 10 wherein said second dielectric layer is formed of polysilicon, and has a thickness in a range of between about 1000 and 3000 Å.

15. The method of claim 10 wherein central spine has a shape selected from the group consisting of: cylindrical and rectangular (box) shape.

16. The method of claim 10 wherein said second conductive layer 38 has a thickness in a range of between about 1000 and 3000 Å.

17. The method of claim 10 wherein said dielectric spacers have a width in a range of between about 500 and 1500 Å, and a height in a range of between about 3000 and 6000 Å.

18. The method of claim 10 wherein said conductive spacers have a width in a range of between about 500 and 2000 Å, and a height in a range of between about 3000 and 6000 Å.

* * * * *